(12) United States Patent
Tserng et al.

(10) Patent No.: US 7,688,152 B2
(45) Date of Patent: Mar. 30, 2010

(54) HIGH FREQUENCY STABILIZATION NETWORK FOR MICROWAVE DEVICES AND MONOLITHIC INTEGRATED CIRCUITS

(75) Inventors: Hua Quen Tserng, Dallas, TX (US); Warren Robert Gaiewski, Lavon, TX (US); David Michael Fanning, Garland, TX (US)

(73) Assignee: TriQuint Semiconductor, Inc, Hillsboro, OR (US)

( * ) Notice: Subject to any disclaimer, the term of this patent is extended or adjusted under 35 U.S.C. 154(b) by 202 days.

(21) Appl. No.: 11/483,814

(22) Filed: Jul. 10, 2006

(65) Prior Publication Data

US 2008/0007357 A1    Jan. 10, 2008

(51) Int. Cl.
*H03B 5/18* (2006.01)

(52) U.S. Cl. ............... 331/96; 331/107 G; 331/107 DP
(58) Field of Classification Search ................... 331/96, 331/107 G, 107 DP
See application file for complete search history.

(56) References Cited

U.S. PATENT DOCUMENTS

| 6,144,264 | A * | 11/2000 | Wen ............................ 331/96 |
| 6,307,442 | B1 * | 10/2001 | Meyer et al. ............... 333/17.1 |
| 6,944,435 | B2 * | 9/2005 | Contopanagos et al. ..... 455/307 |

* cited by examiner

*Primary Examiner*—Arnold Kinkead
(74) *Attorney, Agent, or Firm*—Jackson Walker L.L.P.

(57) ABSTRACT

A high-frequency stabilization network for microwave devices and monolithic integrated circuits. The stabilization network may comprise one or more monolithic RL parallel networks, configured to reduce in-band high-frequency oscillation, such as Gunn effect oscillation and IMPATT oscillation.

18 Claims, 4 Drawing Sheets

HIGH FREQUENCY STABILIZATION NETWORK FOR MICROWAVE DEVICES AND MONOLITHIC INTEGRATED CIRCUITS

FIELD OF THE INVENTION

The present invention is generally related to monolithic microwave integrated circuits (MMICs), and more specifically to suppressing high-frequency oscillations including in-band spurious signals.

BACKGROUND OF THE INVENTION

Transistors and amplifier circuits based on III-V compound semiconductors (i.e., GaAs MESFET, GaAs pHEMT, In PHEMT, GaAs metamorphic HEMTs) are prone to high-frequency oscillation (known as Gunn oscillation) due the negative differential resistance of the velocity-field curve, which generates a traveling Gunn domain propagation, resulting in negative resistance in the drain output. Although the effect has been used for microwave/millimeter-wave generations, it is an undesirable phenomenon for the stable and efficient operation of power amplifiers. Under RF drives, this high-frequency oscillation can manifest itself as spurious signals at undesirable out-of-band frequencies. For high power microwave systems (i.e., for radar applications), the frequency spectrum needs to be spurious free at all frequencies and also near the carrier.

There is currently no effective way at the circuit level to suppress these undesirable oscillations in-band. For instance, conventional reflective filters operate out-of-band. There is desired a method of high-frequency suppression in a simple stabilization circuit monolithically integratable in a MMIC amplifier. Even though Gunn oscillation is cited as the main contributor to the negative drain output resistance, other types of high-frequency oscillations, such as IMPATT oscillation, are also desired to be effectively suppressed.

DETAILED DESCRIPTION OF THE PRESENT INVENTION

Figure 1:
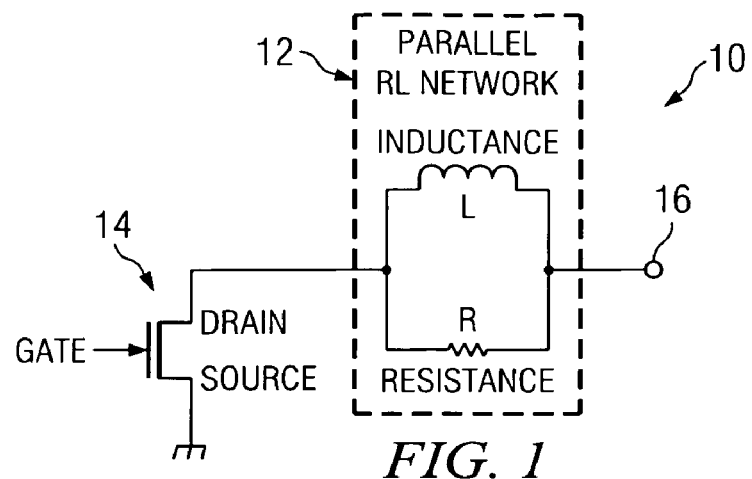
FIG. 1 depicts a stabilization network placed in the output of a microwave FET.

Referring to FIG. 1, there is shown at 10 a high-frequency oscillation suppression circuit 12 configured to suppress in-band high-frequency spurious oscillations of an electronic circuit, shown in this embodiment as a FET 14. This suppression circuit 12 is shown as a parallel RL network including inductor L and resistor R coupled to a portion of the circuit 14, shown as the drain of the FET in this embodiment. At high frequencies, the inductor L electrically appears as a short to the circuit 14, and thus the resistor R is not seen as a resistance between the drain and the node 16. However, the RL parallel network 12 suppresses in-band high-frequency oscillation, including Gunn effect oscillations such as those oscillations caused by the traveling Gunn domain propagation. This stabilization circuit 12 also advantageously suppresses IMPATT oscillations.

In one preferred embodiment, resistor R may have a value of 8 ohms, and the inductance may be about 0.15 nH. This preferred embodiment advantageously reduces or eliminates the negative output resistance of the circuit 14 up to at least 50 GHz. Other values may be used as necessary to suppress oscillations and spurious signals at selected frequencies.

Figure 2:
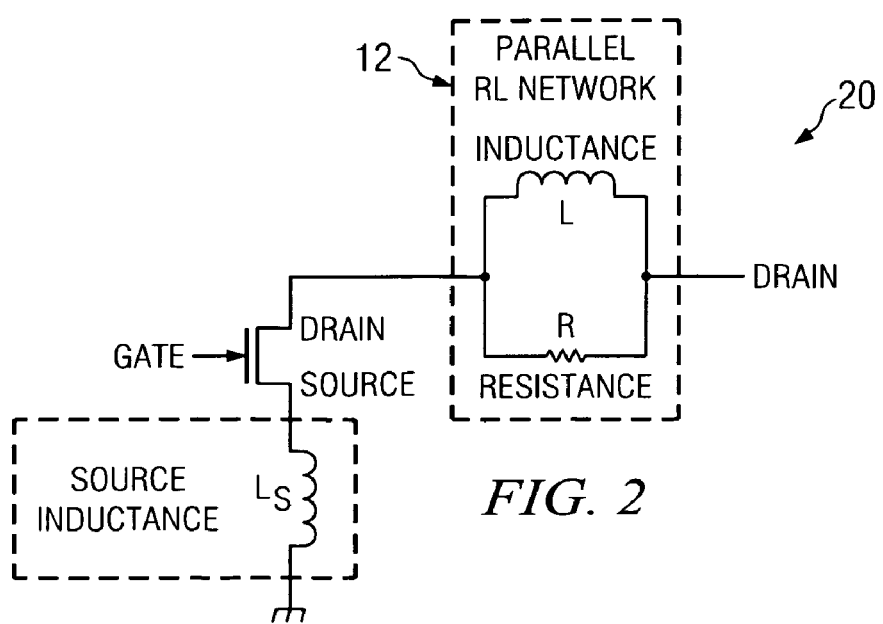
FIG. 2 depicts a second stabilization scheme with source inductance that can be used alone or in conjunction with the RL stabilization network.

Referring to FIG. 2, there is shown at 20 a second embodiment of the present invention where the parallel RL network 12 is coupled to the drain of the FET 14, and further including an additional suppression circuit shown as source inductance Ls coupled between the FET source and ground. The source inductance Ls can be used alone, or in conjunction with the drain RL stabilization network 12. The source inductance Ls further suppresses high-frequency oscillations. The value of the source inductance Ls may be in the range of 0.1 nH to 0.5 nH.

Figure 3:
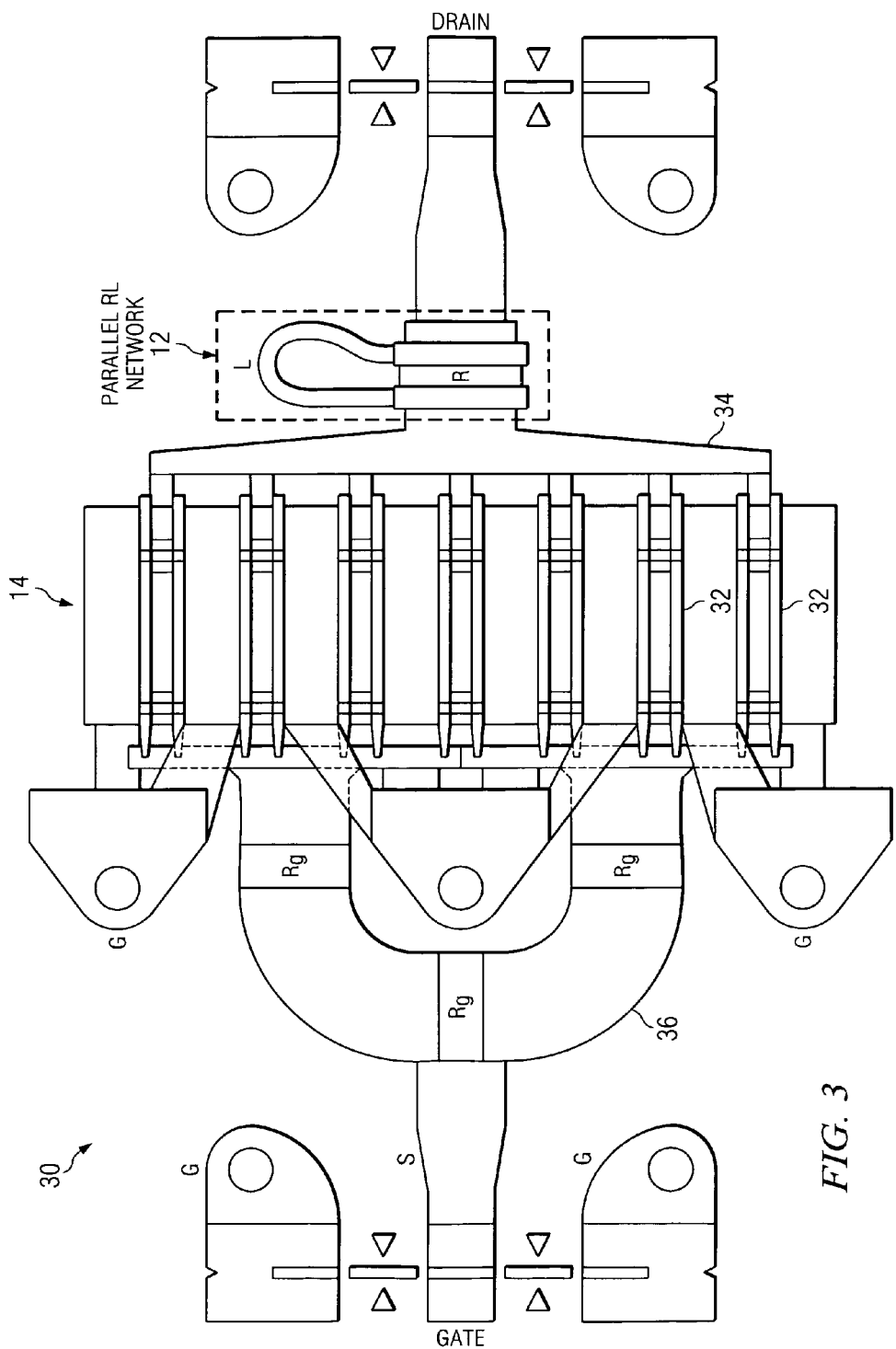
FIG. 3 depicts a practical implementation of the invention at the unit cell level with a single parallel RL circuit placed at the output.

Referring now to FIG. 3 a practical monolithic implementation of the present invention at the unit cell level is shown at 30. As shown, a single parallel RL circuit 12 is coupled to the output of circuit 14, whereby a plurality of gate fingers are shown at 32. FIG. 3 depicts the monolithic implementation of the present invention, whereby the resistor R is formed with the inductor L seen to comprise a circuit trace configured as a loop or shunt in parallel to the resistor R. Also shown in FIG. 3 is a single common node 34 coupled in series between each of the plurality of gate fingers 32 and the resistor R. There is further shown a feed to the gate fingers 32 comprised of a splitter 36 feeding resistors Rg.

Figure 4:
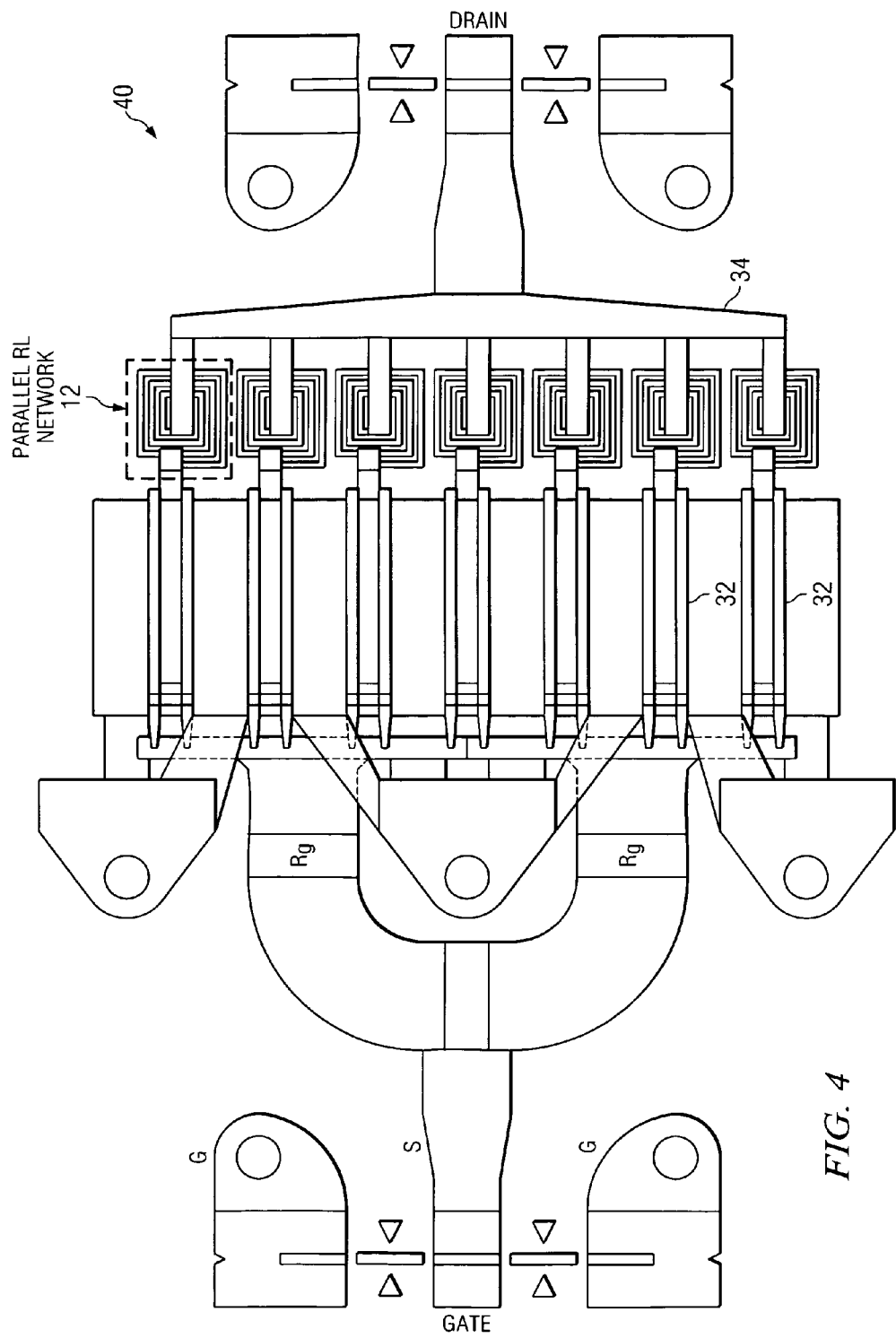
FIG. 4 shows the RL circuit used for every two-finger pair.

Referring now to FIG. 4 there is shown at 40 a RL circuit 12 for every two-finger pair, with the respective RL network 12 coupled in series between each pair of gate fingers 32 and the common node 34, shown as a pad.

Figure 5:
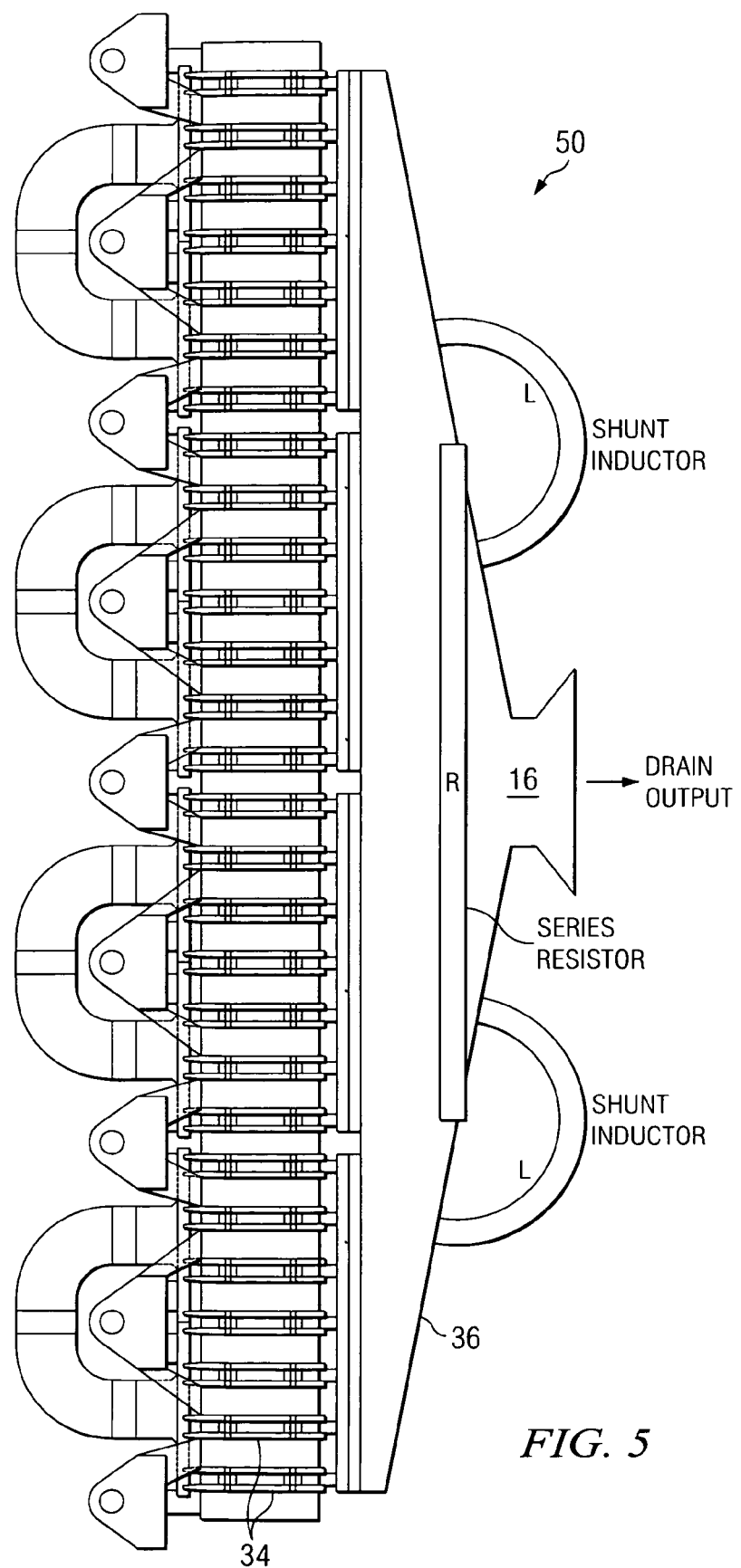
FIG. 5 shows a practical monolithic implementation.

Referring now to FIG. 5, there is shown at 50 a practical monolithically implementation of the present invention whereby pad 36 is seen to include a monolithically formed resistor R extending across the width of the pad 36 between the gate fingers 34 and the output 16. A pair of inductors L are monolithically formed as shunts around each end of the resistor R, and are each formed as a loop. The two shunts forming inductor L are electrically in parallel and form an overall inductance being the sum of each inductor L. The value of the inductor(s) L and resistor R can be optimized depending on the size of the transistors of circuit 14, and the intended frequency of operation.

Advantageously, the parallel RL network 12 may be placed in the output of a microwave field-effect transistor, such as a GaAs MESFET, InP MESFET, GaAs metamorphic HEMT, GaAs or InP pHEMT, provides high-frequency oscillation suppression of transistors and amplifiers for stable operation at design frequency. The stabilization network reduces or even cancels the negative differential resistance, of the velocity-field curve, resulting in negative resistance in the drain output.

Advantageously, this simple stabilization circuit is monolithically integratable in a MMIC amplifier, and further, operates in-band to suppress spurious signals at all frequencies, and also near a designed carrier frequency.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A circuit, comprising;
a FET having high-frequency negative resistance, wherein the FET has a gate, a source, and a drain, and wherein the gate comprises a plurality of monolithically formed gate fingers; and
a stabilization circuit coupled to the FET and configured to reduce the high-frequency negative resistance, wherein the stabilization circuit comprises a resistor and an inductor, and wherein the stabilization circuit is coupled to the drain.

2. The circuit as specified in claim 1 wherein the stabilization circuit is a passive circuit.

3. The circuit as specified in claim 1 wherein the stabilization circuit comprises an inductor in parallel with a resistor.

4. The circuit as specified in claim 1 wherein the stabilization circuit is coupled to an electrical circuit output.

5. The circuit as specified in claim 1 wherein the high-frequency negative resistance is generated by Gunn domain propagation.

6. The circuit as specified in claim 1 wherein the FET is a microwave FET.

7. The circuit as specified in claim 6 wherein the microwave FET is selected from the group of: GaAs MESET, InP MESFET, GaAs metaphoric HEMT, and GaAs or InP pHEMT.

8. The circuit as specified in claim 6 further comprising a second stabilization circuit coupled to the source.

9. The circuit as specified in claim 6 further comprising a second stabilization circuit coupled to the gate.

10. The circuit as specified in claim 8 wherein the second stabilization circuit comprises an inductor.

11. The circuit as specified in claim 8 wherein the second stabilization circuit comprises a resistor.

12. The circuit as specified in claim 8 wherein the second stabilization circuit comprises an RL parallel network.

13. The circuit as specified in claim 1 wherein the high frequency negative resistance generates a high-frequency oscillation.

14. The circuit as specified in claim 13 wherein the oscillation is an IMPATT oscillation.

15. The circuit as specified in claim 1 wherein the stabilization circuit comprises a first RL parallel network coupled between at least two said gate fingers, and comprising a second RL parallel network coupled between another two said gate fingers.

16. The circuit as specified in claim 15 comprising a common electrical pad coupled to the first and second RL parallel networks.

17. The circuit as specified in claim 1 wherein the stabilization circuit comprises monolithically formed RL parallel networks coupled between a plurality of the gate fingers.

18. The circuit as specified in claim 1 wherein the electrical circuit and the stabilization circuit are monolithic.

* * * * *